US012693328B2

(12) United States Patent
Haneda et al.

(10) Patent No.: US 12,693,328 B2
(45) Date of Patent: Jul. 28, 2026

(54) MEASUREMENT APPARATUS AND MEASUREMENT METHOD

(71) Applicant: HIOKI E.E. CORPORATION, Nagano (JP)

(72) Inventors: Kazuaki Haneda, Nagano (JP); Tomohiro Yokoyama, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 196 days.

(21) Appl. No.: 18/708,667

(22) PCT Filed: Oct. 24, 2022

(86) PCT No.: PCT/JP2022/039459
§ 371 (c)(1),
(2) Date: May 9, 2024

(87) PCT Pub. No.: WO2023/085057
PCT Pub. Date: May 19, 2023

(65) Prior Publication Data
US 2024/0418768 A1      Dec. 19, 2024

(30) Foreign Application Priority Data
Nov. 10, 2021      (JP) ................................. 2021-183708

(51) Int. Cl.
G01R 31/28      (2006.01)
(52) U.S. Cl.
CPC ................................ G01R 31/2832 (2013.01)
(58) Field of Classification Search
CPC ........................... G01R 31/2832; G01R 27/02
See application file for complete search history.

(56) References Cited

U.S. PATENT DOCUMENTS

| 10,890,642 B1* | 1/2021 | Kasper | G01R 31/389 |
| 2011/0227587 A1* | 9/2011 | Nakanishi | G01R 31/389 |
| | | | 324/649 |

(Continued)

FOREIGN PATENT DOCUMENTS

| EP | 3 879 279 A1 | 9/2021 |
| JP | H06-109783 A | 4/1994 |

(Continued)

OTHER PUBLICATIONS

International Search Report for corresponding International Application No. PCT/JP2022/039459 mailed Nov. 29, 2022.

(Continued)

*Primary Examiner* — Akm Zakaria
(74) *Attorney, Agent, or Firm* — Chrisman Gallo Tochtrop LLC

(57) ABSTRACT

There is realized a measurement apparatus capable of highly accurate synchronous detection while keeping costs low. A measurement apparatus is characterized by including: a current generation circuit causing an alternating constant current corresponding to a reference signal (Ss) with a predetermined frequency to occur and supplying the alternating constant current to a measurement target object; a voltage detection circuit detecting a voltage v that has occurred in the measurement target object; a signal generation circuit detecting a current i flowing in the measurement target object and generating a binary signal (Sip) synchronized with the current i; a first synchronous detection unit performing synchronous detection of the voltage v based on the reference signal (Ss) and calculating an amplitude |V| of the voltage v and a voltage phase difference $\varphi v$; a second synchronous detection unit performing synchronous detection of the binary signal (Sip) based on the reference signal (Ss) and calculating a current phase difference $\varphi i$; and an arithmetic unit calculating electrical characteristics of the (Continued)

measurement target object based on the amplitude |V| of the voltage and the voltage phase difference φv, the current phase difference φi, and an amplitude |I| of the current.

5 Claims, 3 Drawing Sheets

| | | | |
|---|---|---|---|
| JP | 2015122701 A | * | 7/2015 |
| JP | 2015-161631 A | | 9/2015 |
| JP | 2018-036205 A | | 3/2018 |
| JP | 2020-012721 A | | 1/2020 |
| JP | 2020-076600 A | | 5/2020 |
| WO | 2020/095471 A1 | | 5/2020 |

(56)     References Cited

U.S. PATENT DOCUMENTS

| | | | |
|---|---|---|---|
| 2017/0179737 A1* | 6/2017 | Emi | H01M 10/48 |
| 2018/0067154 A1* | 3/2018 | Cherkassky | A61B 5/7235 |
| 2020/0112169 A1* | 4/2020 | Bao | G01R 1/36 |

FOREIGN PATENT DOCUMENTS

| | | |
|---|---|---|
| JP | 2007-132806 A | 5/2007 |
| JP | 2015-014469 A | 1/2015 |

OTHER PUBLICATIONS

Written Opinion for corresponding International Application No. PCT/JP2022/039459 dated Nov. 29, 2022 and English translation.
Second Office Action dated Sep. 25, 2025 in the corresponding JP application No. 2021-183708 and English translation.
First Office Action dated May 27, 2025 in the corresponding JP application No. 2021-183708 May 27, 2025.

* cited by examiner

MEASUREMENT APPARATUS AND MEASUREMENT METHOD

CROSS-REFERENCE TO RELATED APPLICATIONS

This application is a national stage entry of International Application No. PCT/JP2022/039459 filed on Oct. 24, 2022, which claims the benefit of priority to Japanese Application No. 2021-183708, filed Nov. 10, 2021, the entire disclosures of which are hereby incorporated herein by reference.

TECHNICAL FIELD

The present disclosure relates to a measurement apparatus and a measurement method, and relates to, for example, a measurement apparatus and a measurement method for measuring electrical characteristics of a measurement target object.

BACKGROUND ART

Conventionally, there have been known measurement apparatuses such as an LCR meter, a C meter, and a battery tester for measuring electrical characteristics of a measurement target object (hereinafter also referred to as "a DUT (Device Under Test)", such as impedance, by synchronous detection (for example, see Patent Literature 1).

Document List

Patent Literature

Patent Literature 1: Japanese Patent Application Publication No. 2020-76600

Summary of Disclosure

Technical Problem

Conventionally, the two methods shown below have been known as methods for synchronous detection adopted for measurement instruments.

A first method is a method of converting each of a current flowing in a DUT and voltage occurring in the DUT when a signal is applied to the DUT to a digital signal, and performing synchronous detection by digital signal processing, by an FPGA (Field Programmable Gate Array), an MCU (Micro Controller Unit), or the like. Hereinafter, the first method is also referred to as "digital-method synchronous detection".

A second method is a method of performing synchronous detection by performing frequency modulation of a voltage that occurs in a DUT when a current is applied to the DUT, based on a reference signal synchronized with a current flowing through the DUT. Hereinafter, the second method is also referred to as "analog-method synchronous detection".

Specifically, in the analog-method synchronous detection, a sine-wave-shaped constant current is applied to a DUT, a voltage that occurs in the DUT is detected, and a voltage signal is generated. Further, F at this time, a square wave reference signal corresponding to a current flowing in the DUT is generated. Thereafter, a signal obtained by multiplying the voltage signal that has occurred in the DUT by −1 is generated, and the voltage signal that has occurred in the DUT and the signal obtained by being multiplied by −1 are inputted to a 2-input 1-output switch. Then, by alternately switching the connection destination of output of the switch between the two inputs according to the reference signal, the same frequency component as the reference signal is modulated to a direct current component. Furthermore, an output signal of the switch is outputted through a low pass filter. Thereby, synchronous detection between the voltage signal that has occurred in the DUT and the reference signal is performed, and an amplitude of the same frequency component as the reference signal and $|V| \cos \theta$, which is a value proportional to $\cos \theta$ for a phase difference $\theta$ between the reference signal and the voltage signal, are obtained. Thereby, $R = |V|/|I| \times \cos \theta$ can be obtained as a measurement result of impedance of the DUT.

In the case of the digital-method synchronous detection, however, it is necessary to measure not only the voltage that has occurred in the DUT but also the current flowing in the DUT and perform A/D conversion. Therefore, there is a problem that, in order to realize highly accurate A/D conversion, increase in development costs due to expensive parts, a large implementation area, and increase in development man-hours is caused. Further, in a case where it is required to mutually electrically insulate a circuit for generating a current to be applied to a DUT, and an arithmetic circuit and the like, for example, like a battery tester, it is necessary to transmit A/D-converted data with a large amount of information to a CPU side in a state of electrically insulating the circuits, which causes complicatedness of a communication circuit.

In the case of the analog-method synchronous detection, a reference signal used for the synchronous detection is square-wave-shaped and includes a harmonic component. Therefore, by performing switching by a lock-in amplifier, the harmonic component of the reference signal is also modulated to a direct current, and there is a problem that the accuracy of measurement of impedance decreases. Further, since the reference signal is generated from a current that is an analog signal, a phase adjustment circuit (an analog circuit) for performing phase adjustment of the reference signal is required. Therefore, there is also a problem that increase in the development costs and the like due to expensive parts and a large implementation area is caused.

The present disclosure has been made in view of the above problems, and an object is to realize a measurement apparatus capable of highly accurate synchronous detection while keeping the costs low.

Solution to Problem

A measurement apparatus according to a representative embodiment of the present disclosure is characterized by including: a current generation circuit causing an alternating constant current corresponding to a reference signal with a predetermined frequency to occur and supplying the alternating constant current to a measurement target object; a voltage detection circuit detecting a voltage that has occurred in the measurement target object; a signal generation circuit detecting a current flowing in the measurement target object and generating a binary signal synchronized with the detected current; a first synchronous detection unit performing synchronous detection of the voltage detected by the voltage detection circuit, based on the reference signal and calculating an amplitude of the voltage and a voltage phase difference that is a phase difference between the voltage and the reference signal; a second synchronous detection unit performing synchronous detection of the binary signal based on the reference signal and calculating a current phase difference that is a phase difference between the current flowing in the measurement target object and the reference signal; and an arithmetic unit calculating electrical characteristics of the measurement target object based on the amplitude of the voltage and the voltage phase difference calculated by the first synchronous detection unit, the current phase difference calculated by the second synchronous detection unit, and an amplitude of the current flowing in the measurement target object.

Effects of Disclosure

According to a measurement apparatus according to the present disclosure, highly accurate synchronous detection becomes possible, with costs being kept low.

DESCRIPTION OF EMBODIMENT

1. Summary of Embodiment

Figure 1:
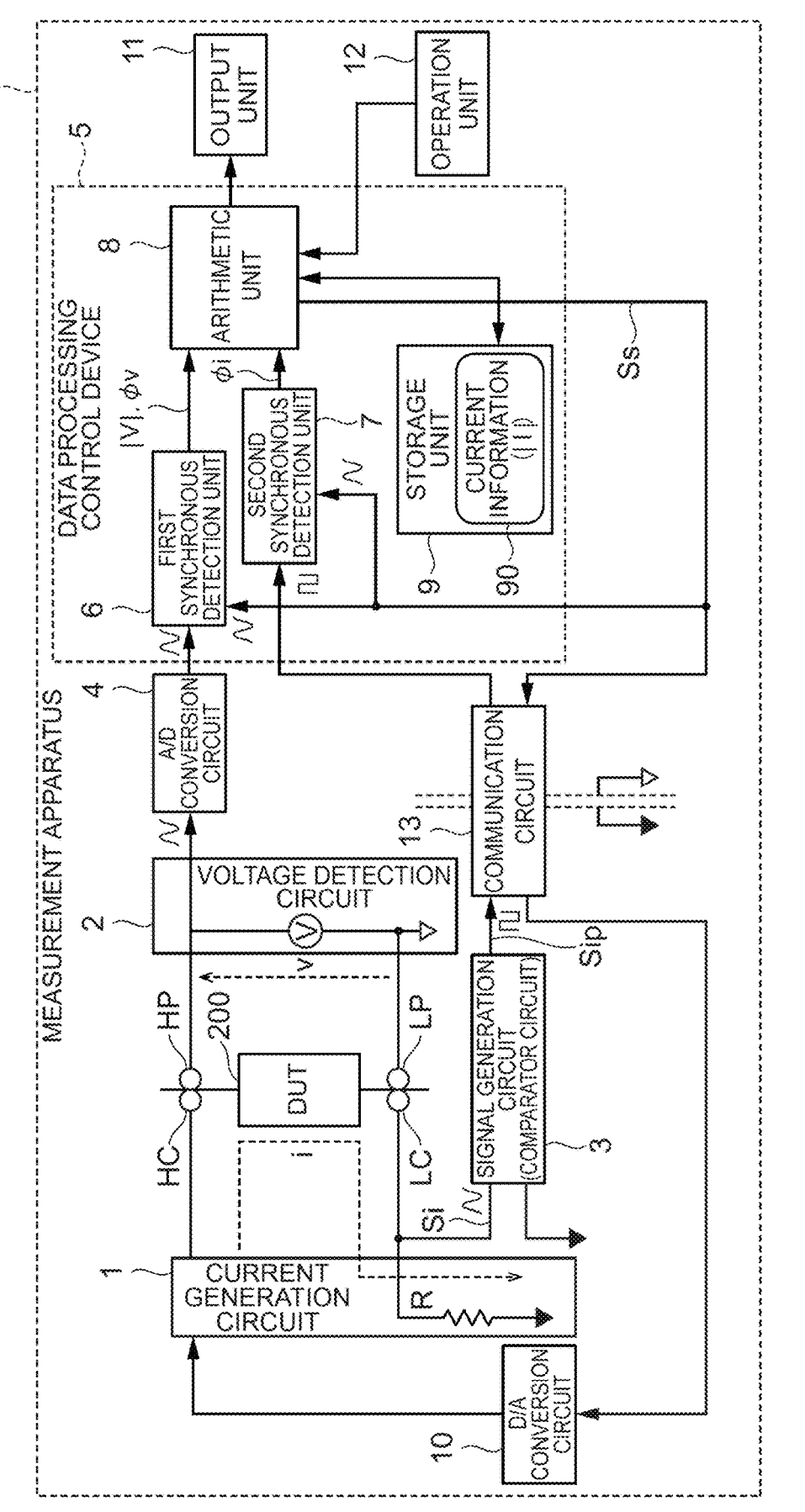
FIG. 1 A diagram showing a configuration of a measurement apparatus according to one embodiment of the present disclosure.

First, a summary of a representative embodiment of the disclosure disclosed in the present application will be described. In the description below, reference signs on drawings corresponding to components of the disclosure are written in parentheses as an example.

[1] A measurement apparatus (100) according to a representative embodiment of the present disclosure is characterized by including: a current generation circuit (1) causing an alternating constant current corresponding to a reference signal (Ss) with a predetermined frequency to occur and supplying the alternating constant current to a measurement target object (200); a voltage detection circuit (2) detecting a voltage that has occurred in the measurement target object; a signal generation circuit (3) detecting a current flowing in the measurement target object and generating a binary signal (Sip) synchronized with the detected current; a first synchronous detection unit (6) performing synchronous detection of the voltage detected by the voltage detection circuit, based on the reference signal and calculating an amplitude (|V|) of the voltage and a voltage phase difference ($\varphi$v) that is a phase difference between the voltage and the reference signal; a second synchronous detection unit (7) performing synchronous detection of the binary signal based on the reference signal and calculating a current phase difference ($\varphi$i) that is a phase difference between the current flowing in the measurement target object and the reference signal; and an arithmetic unit (8) calculating electrical characteristics of the measurement target object based on the amplitude of the voltage and the voltage phase difference calculated by the first synchronous detection unit, the current phase difference calculated by the second synchronous detection unit, and an amplitude (|I|) of the current flowing in the measurement target object.

[2] The measurement apparatus according to [1] above may further include a communication circuit (13) performing, in a state of a first circuit side including the signal generation circuit and a second circuit side including the first synchronous detection unit, the second synchronous detection unit, and the arithmetic unit being electrically insulated from each other, transmission/reception of signals between the first circuit side and the second circuit side.

[3] In the measurement apparatus according to [1] or [2] above, the signal generation circuit may compare a voltage signal (Si) obtained by converting the current flowing in the measurement target object to a voltage and a reference voltage and generate the binary signal corresponding to a result of the comparison.

[4] In the measurement apparatus according to any of [1] to [3] above, the first synchronous detection unit may calculate the amplitude of the voltage and the voltage phase difference by multiplying a digital signal of the voltage detected by the voltage detection circuit and a digital signal indicating the reference signal and multiplying the digital signal of the voltage detected by the voltage detection circuit and a digital signal with a phase displaced by 90° relative to the reference signal, and the second synchronous detection unit may calculate the current phase difference by multiplying the binary signal and the digital signal indicating the reference signal and multiplying the binary signal and the digital signal with the phase displaced by 90° relative to the reference signal.

[5] A measurement method according to the representative embodiment of the present disclosure is characterized by including: a first step (S5) of, by performing synchronous detection of a voltage that occurs in a measurement target object when an alternating constant current corresponding to a reference signal with a predetermined frequency is supplied to the measurement target object, based on the reference signal, calculating an amplitude of the voltage and a voltage phase difference that is a phase difference between the voltage and the reference signal; a second step (S6) of, by performing synchronous detection of a binary signal synchronized with a current flowing in the measurement target object when the constant current is supplied to the measurement target object, based on the reference signal, calculating a current phase difference that is a phase difference between the current flowing in the measurement target object and the reference signal; and a third step (S7) of calculating electrical characteristics of the measurement target object based on the amplitude of the voltage and the voltage phase difference calculated at the first step and the current phase difference calculated at the second step.

2. Specific Example of Embodiment

Hereinafter, a specific example of the embodiment of the present disclosure will be described with reference to drawings. In the description below, components common to the embodiments will be given the same reference signs, and repeated description will be omitted.

FIG. 1 is a diagram showing a configuration of a measurement apparatus 100 according to one embodiment of the present disclosure.

The measurement apparatus 100 shown in FIG. 1 is an apparatus for measuring electrical characteristics of a measurement target object (hereinafter also referred to as "a DUT") 200. As the measurement apparatus 100, an LCR meter or a capacitance meter capable of measurement of impedance by a four-terminal method and a battery tester for measuring characteristics of a battery can be exemplified. The measurement apparatus 100 only needs to be an apparatus capable of measuring electrical characteristics of the impedance and the like of the DUT 200 and is not limited to the above examples.

As shown in FIG. 1, the measurement apparatus 100 includes external terminals HC, LC, HP, and LP, a current generation circuit 1, a voltage detection circuit 2, a signal generation circuit 3, an A/D conversion circuit 4, a data processing control device 5, a D/A conversion circuit 10, an output unit 11, an operation unit 12, and a communication circuit 13.

The external terminals HC, LC, HP, and LP are terminals for connecting the DUT 200. For example, one terminal of the DUT 200 is connected to the external terminals HC and HP as high-side terminals, and the other terminal of the DUT 200 is connected to the external terminals LP and LC as low-side terminals. Though description will be made on a case of measuring the DUT 200 by a four-terminal method using the external terminals HC, LC, HP, and LP in the present embodiment, the present disclosure is not limited thereto, and the DUT 200 may be measured by a two-terminal method.

The measurement apparatus 100 applies an alternating-current signal or the like to the DUT 200, which is connected, for example, between the external terminals HC, HP and the external terminals LP, LC, between the external terminals HC and LC, detects each of a voltage v that occurs between the external terminals HP and LP and a current i that flows from the external terminal HC into the external terminal LC via the DUT 200 at that time, and measures the impedance of the DUT 200 based on the detected voltage v and current i.

The current generation circuit 1 is a circuit that generates an alternating-current signal to be supplied to the DUT 200 to measure the impedance of the DUT 200. Specifically, the current generation circuit 1 is a constant current source circuit that causes an alternating constant current corresponding to a reference signal Ss with a predetermined frequency to occur and supplies the alternating constant current to the DUT 200.

The current generation circuit 1 generates, for example, an alternating constant current signal synchronized with the reference signal Ss based on data of the reference signal Ss outputted from the data processing control device 5 to be described later.

Here, the reference signal Ss is a signal to be a reference in synchronous detection to be described later and is a signal with a predetermined frequency f and a predetermined amplitude. The reference signal Ss is, for example, a sine wave signal. For example, the data processing control device 5 outputs a digital signal (data) representing the sine wave signal as the reference signal Ss, and the D/A conversion circuit 10 converts the digital signal to an analog signal (a voltage) and supplies the analog signal to the current generation circuit 1. The current generation circuit 1 causes an alternating current with a frequency and an amplitude corresponding to the inputted analog signal to occur. Specifically, the current generation circuit 1 generates a constant current ($i=|I|\sin(2\eta ft)$) with the frequency f and a constant amplitude $|I|$ synchronized with the reference signal Ss and supplies the constant current to the DUT 200.

The voltage detection circuit 2 is a circuit connected to each of the external terminals HP and LP and detects the voltage v between the external terminals HP and LP. The voltage detection circuit 2 includes, for example, an operational amplifier, and the voltage detection circuit 2 amplifies the detected voltage v between the external terminals HP and LP by the operational amplifier and outputs the voltage as a voltage signal.

The A/D conversion circuit 4 converts the voltage v detected by the voltage detection circuit 2 to a digital signal by sampling the voltage v at a predetermined sampling period (for example, a period that is sufficiently short relative to the period of the constant current signal outputted from the current generation circuit 1) and outputs the digital signal as voltage data. The A/D conversion circuit 4 may be realized by an electronic part that is different from the data processing control device 5 to be described later or may be realized by an A/D converter as a peripheral circuit that the data processing control device 5 is equipped with.

The signal generation circuit 3 is a circuit that generates a signal corresponding to the current i flowing in the DUT 200. The signal generation circuit 3 detects the current i flowing in the DUT 200 and generates a binary signal synchronized with the current i.

For example, the current generation circuit 1 includes a sense resistance R connected with the external terminal HC and LC, and the DUT 200 in series, and sense resistance R generates a voltage signal Si that is obtained by converting the current i flowing in the DUT 200 to a voltage. The signal generation circuit 3 generates a binary signal based on the voltage signal S1 and outputs the binary signal as a current phase signal Sip. As the signal generation circuit 3, for example, a publicly known comparator circuit that compares two voltages and outputs a binary comparison result can be adopted.

Figure 2:
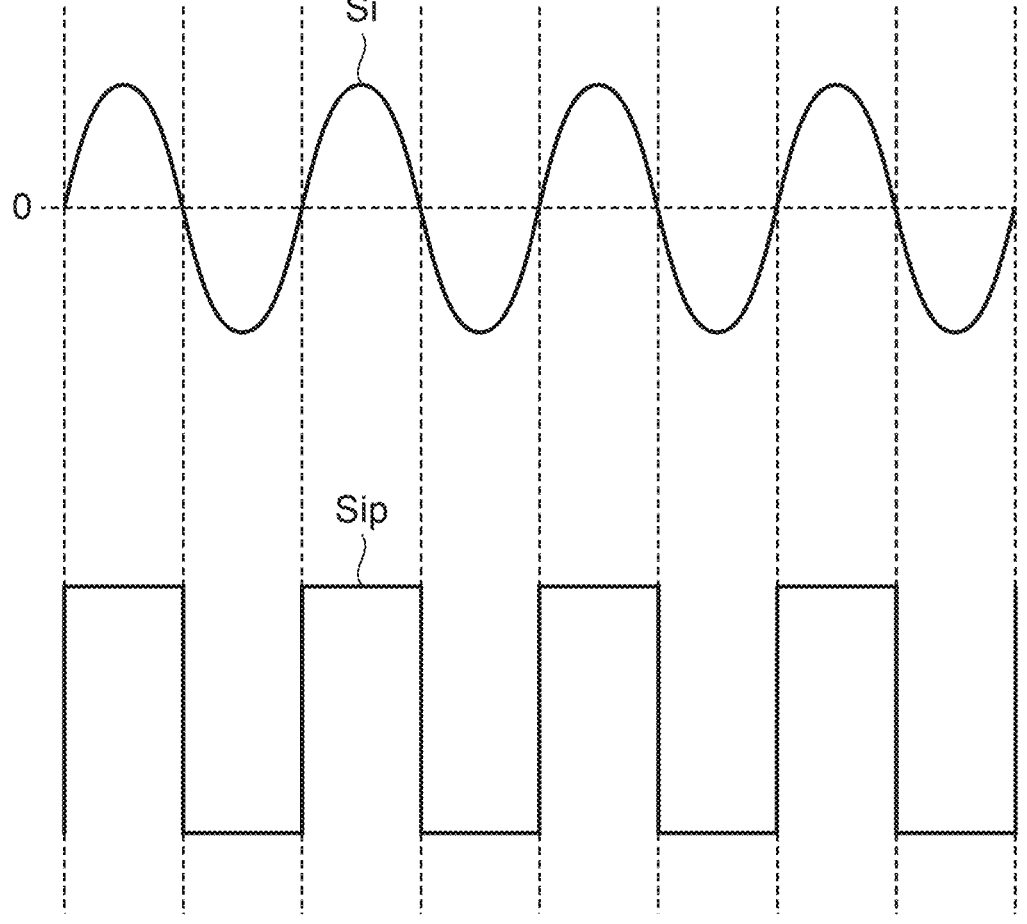
FIG. 2 A diagram for illustrating a method for generating a current phase signal by a signal generation circuit.

FIG. 2 is a diagram for illustrating a method for generating the current phase signal Sip by the signal generation circuit 3.

As shown in FIG. 2, the signal generation circuit 3 compares the voltage signal Si obtained by converting the current i flowing in the DUT 200 to a voltage and a reference voltage (for example, 0 V) and generates a binary signal corresponding to a result of the comparison. The binary signal generated in this way is a signal synchronized with the phase of the current i flowing in the DUT 200 and is outputted as the current phase signal Sip.

The communication circuit 13 is a circuit that performs transmission/reception of signals between circuits. For example, in the measurement apparatus 100, a first circuit side that includes the current generation circuit 1, the signal generation circuit 3, and the D/A conversion circuit 10 and a second circuit side that includes the data processing control device 5 (a first synchronous detection unit 6, a second synchronous detection unit 7, an arithmetic unit 8, and a storage unit 9 to be described later) are mutually different in power-supply voltage and ground voltage. The communication circuit 13 performs transmission/reception of signals between the first circuit side and the second circuit side in a state of the first circuit side and the second circuit side being electrically insulated from each other.

For example, the communication circuit 13 transmits the reference signal Ss outputted from the data processing control device 5 to the D/A conversion circuit 10 in a state of the data processing control device 5 and the D/A conversion circuit 10 being electrically insulated from each other. Further, the communication circuit 13 transmits the current phase signal Sip generated by the signal generation circuit 3 to the data processing control device 5 (the second synchronous detection unit 7) in a state of the signal generation circuit 3 and the data processing control device 5 being electrically insulated from each other. As the communication circuit 13, a circuit using capacitive coupling or magnetic coupling such as a digital isolator, a circuit using optical communication such as a photo coupler, and the like can be exemplified.

The operation unit 12 is an input interface for a user to operate the measurement apparatus 100. As the operation unit 12, various kinds of buttons, a touch panel, and the like can be exemplified. For example, by the user operating the operation unit 12, it is possible to set various kinds of measurement conditions and the like for measuring the DUT 200 for the measurement apparatus 100 and instruct the measurement apparatus 100 to execute and stop measurement.

The data processing control device 5 is a functional unit that comprehensively controls the functional units in the measurement apparatus 100. The data processing control device 5 is a device capable of digital signal processing. As the data processing control device 5, an MCU, an FPGA, or the like as a program processing device that includes a processor such as a CPU, a storage device such as a ROM, a RAM, or a flash memory, and peripheral circuits such as a timer can be exemplified.

The data processing control device 5 includes the first synchronous detection unit 6, the second synchronous detection unit 7, the arithmetic unit 8, and the storage unit 9 as functional units for measuring electrical characteristics. These functional blocks are realized, for example, by the processor executing various kinds of arithmetic processing according to a program stored in the storage device to control the peripheral circuits in the program processing device as the data processing control device 5.

The storage unit 9 is a functional unit that stores arithmetic expressions and various kinds of parameters required to measure the electrical characteristics of the DUT 200, calculation results by the arithmetic unit 8 and the like, and the like.

The first synchronous detection unit 6 is a functional unit that performs synchronous detection among the voltage v that has occurred in the DUT 200 and the reference signal Ss. The first synchronous detection unit 6 performs synchronous detection of the voltage v detected by the voltage detection circuit 2 based on the reference signal Ss and calculates an amplitude $|V|$ of the voltage v and a voltage phase difference $\varphi v$ that is a phase difference between the voltage v and the reference signal Ss.

More specifically, the first synchronous detection unit 6 calculates $|V| \cos \varphi v$ by multiplying the digital signal of the voltage v detected by the voltage detection circuit 2 and the digital signal indicating the reference signal Ss. Further, the first synchronous detection unit 6 calculates $|V| \sin \varphi v$ by performing multiplication of the digital signal of the voltage v detected by the voltage detection circuit 2 and a digital signal with a phase displaced by 90° relative to the reference signal Ss. Then, the first synchronous detection unit 6 calculates each of the amplitude $|V|$ of the voltage v and the voltage phase difference $\varphi v$ based on $|V| \cos \varphi v$ and $|V| \sin \varphi v$.

Information about the amplitude $|V|$ of the voltage v and the voltage phase difference $\varphi v$ that have been calculated is inputted to the arithmetic unit 8. The information about the amplitude $|V|$ of the voltage v and the voltage phase difference $\varphi v$ may be stored into the storage unit 9.

The second synchronous detection unit 7 is a functional unit that performs synchronous detection between the current i flowing in the DUT 200 and the reference signal Ss. The second synchronous detection unit 7 performs synchronous detection of the current phase signal Sip, which is a binary signal generated by the signal generation circuit 3, based on the reference signal Ss and calculates a current phase difference $\varphi i$, which is a phase difference between the current i flowing in the DUT 200 and the reference signal Ss.

More specifically, the second synchronous detection unit 7 calculates $|Ix| \cos \varphi i$ by performing multiplication of the current phase signal Sip and the digital signal indicating the reference signal Ss. Further, the second synchronous detection unit 7 calculates $|Ix| \sin \varphi i$ by performing multiplication of the current phase signal Sip and the digital signal with the phase displaced by 90° relative to the reference signal Ss. Then, the second synchronous detection unit 7 calculates the current phase difference $\varphi i$ based on $|Ix| \cos \varphi i$ and $|Ix| \sin \varphi i$.

Information about the current phase difference $\varphi i$ is inputted to the arithmetic unit 8. The information about the current phase difference $\varphi i$ may be stored into the storage unit 9.

Here, an amplitude $|Ix|$ of a current obtained by synchronous detection by the second synchronous detection unit 7 is not such that indicates the amplitude of the current i flowing in the DUT 200. This is because the current phase signal Sip targeted by synchronous detection is a binary signal that does not include information about the amplitude of the current i but includes only information about the phase of the current i. Therefore, the second synchronous detection unit 7 does not output the amplitude $|Ix|$ of the current but outputs only the current phase difference $\varphi i$.

The arithmetic unit 8 is a functional unit that controls each functional unit in the measurement apparatus 100. For example, by outputting the data of the reference signal Ss in response to an operation of the operation unit 12 by the user, the arithmetic unit 8 instructs the current generation circuit 1 to apply a current to the DUT 200 and instructs the first synchronous detection unit 6 and the second synchronous detection unit 7 to execute digital calculation related to synchronous detection.

Further, the arithmetic unit 8 calculates the electrical characteristics of the DUT 200. Specifically, the arithmetic unit 8 calculates the impedance of the DUT 200 based on the amplitude $|V|$ of the voltage, the voltage phase difference $\varphi v$, the current phase difference $\varphi i$, and the amplitude $|I|$ of the current i flowing in the DUT 200.

Here, the amplitude $|I|$ of the current i flowing in the DUT 200 is a known value. That is, the current i flowing in the DUT 200 has the same amplitude and frequency as the constant current generated by the current generation circuit 1 based on the reference signal Ss. That is, the amplitude $|I|$ of the current i is a constant value regardless of the impedance of the DUT 200. Therefore, the value of the amplitude $|I|$ of the current i can be stored in the storage unit 9 as current information 90 in advance.

The amplitude $|I|$ of the current i is decided according to the reference signal Ss. Therefore, when the data of the reference signal Ss can be changed by the user, the arithmetic unit 8 may update the value (the current information 90) of the amplitude $|I|$ of the current i stored in the storage unit 9 according to change in the data of the reference signal Ss.

By performing calculation using the current information 90 stored in the storage unit 9, the amplitude $|V|$ of the voltage and the voltage phase difference $\varphi v$ calculated by the first synchronous detection unit 6, and the current phase difference $\varphi i$ calculated by the second synchronous detection unit 7, the arithmetic unit 8 calculates, for example, each of $|Z| = |V|/|I|$ and a phase $\theta = \varphi v - \varphi i$ as information about the impedance of the DUT 200, stores the information into the storage unit 9, and gives the information to the output unit 11.

The output unit 11 is a functional unit for outputting various kinds of information such as measurement conditions and measurement results in the measurement apparatus 100. The output unit 11 is, for example, a display device equipped with an LCD (Liquid Crystal Display) or an organic EL display. For example, when measurement of the impedance of the DUT 200 is specified by input to the operation unit 12 by the user, the output unit 11 displays information about the impedance of the DUT 200 calculated by the arithmetic unit 8 on the screen.

The output unit 11 may be a display device equipped with a touch panel that realizes a part of functions as the operation unit 12. Further, the output unit 11 may include a communication circuit or the like that wiredly or wirelessly outputs data such as a measurement result to the outside.

Next, description will be made on a flow of impedance measurement by the measurement apparatus 100 according to the present embodiment.

Figure 3:
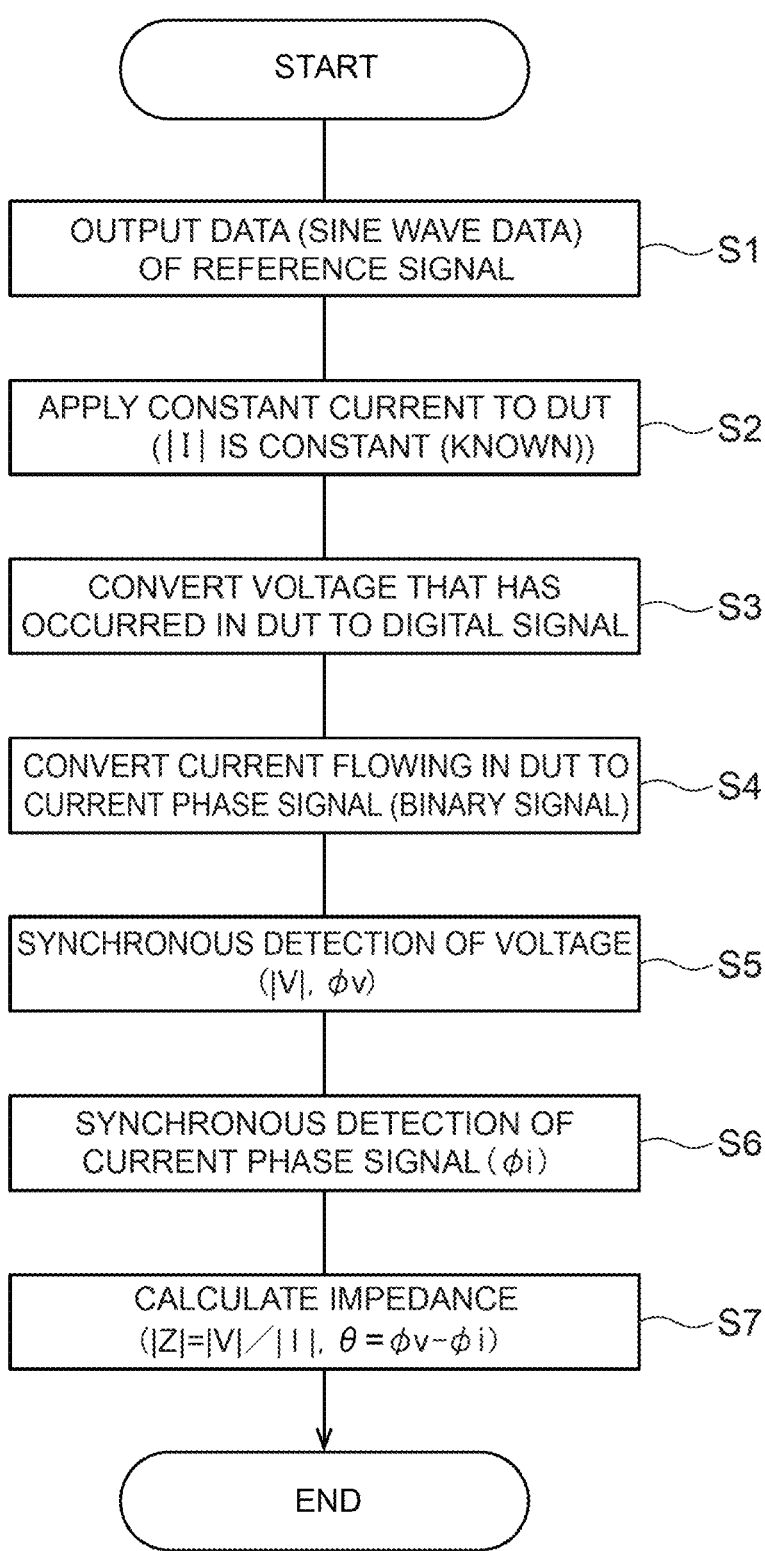
FIG. 3 A flowchart showing a flow of impedance measurement by the measurement apparatus according to the one embodiment of the present disclosure.

FIG. 3 is a flowchart showing the flow of the impedance measurement by the measurement apparatus 100 according to the one embodiment of the present disclosure.

For example, when the user operates the operation unit 12 to specify measurement of the impedance of the DUT 200, the arithmetic unit 8 outputs the data (for example, sine wave data) of the reference signal Ss (step S1).

Thereafter, the D/A conversion circuit 10 converts the data of the reference signal Ss outputted by the arithmetic unit 8 and received via the communication circuit 13 to an analog signal (a voltage), and the current generation circuit 1 generates a constant current based on the analog signal converted by the D/A conversion circuit 10 and supplies the constant current to the DUT 200 (step S2).

Thereafter, the voltage detection circuit 2 detects a voltage v that has occurred in the DUT 200, and the A/D conversion circuit 4 converts the detected voltage v to a digital signal (step S3). Further, the signal generation circuit 3 generates a current phase signal Sip (a binary signal) corresponding to a current i flowing in the DUT 200 by the method described above and transmits the current phase signal Sip to the data processing control device 5 (the second synchronous detection unit 7) via the communication circuit 13 (step S4).

Thereafter, the first synchronous detection unit 6 performs synchronous detection of the voltage v converted to the digital signal at step S3, based on the reference signal Ss by the method described above. Thereby, an amplitude |V| of the voltage v that has occurred in the DUT 200 and a voltage phase difference φv are obtained.

Further, the second synchronous detection unit 7 performs synchronous detection of the current phase signal Sip received at step S4 based on the reference signal Ss (step S6). Thereby, a current phase difference φi of the current i flowing in the DUT 200 is obtained.

Thereafter, the arithmetic unit 8 calculates the impedance of the DUT 200 (step S7). Specifically, as described above, the arithmetic unit 8 calculates $|Z|=|v|/|I|$ and a phase $\theta=\varphi v-\varphi i$ of the DUT 200, based on the amplitude |V| of the voltage v and the voltage phase difference φv calculated at step S5, the current phase difference φi of the current i calculated at step S6, and the amplitude |I| of the current i stored in the storage unit 9. Information about the calculated impedance of the DUT 200 is displayed, for example, on the screen of the display device as the output unit 11.

As described above, the measurement apparatus 100 according to the present embodiment applies a constant current based on the reference signal Ss to the DUT 200, converts the current i flowing in the DUT 200 then to the current phase signal Sip, which is a binary signal including phase information about the current i, and performs synchronous detection of the current phase signal Sip with the reference signal Ss.

According thereto, it is not necessary to perform A/D conversion of a detection signal of the current i unlike a measurement apparatus that performs conventional digital-method synchronous detection, and, therefore, it is possible to reduce the number of required A/D conversion circuits. Thereby, it is possible to suppress increase in development costs due to expensive parts, a large implementation area, increase in development man-hours, and the like.

Here, since the current phase signal Sip has the phase information about the current i but does not have amplitude information about the current i, it is not possible to calculate the amplitude |I| of the current i by performing synchronous detection of the current phase signal Sip. However, since a constant current with a constant amplitude is applied to the DUT 200 regardless of the impedance of the DUT 200, the amplitude |I| of the current i flowing in the DUT 200 is constant (known) and is not required to be calculated by synchronous detection.

Further, a sine wave can be used as the reference signal Ss used for synchronous detection in the measurement apparatus 100. According thereto, in comparison with a measurement apparatus that performs the conventional analog-method synchronous detection using a square wave (a pulse) as a reference signal, more accurately impedance measurement becomes possible because a harmonic component is not included in a reference signal.

Further, since the reference signal Ss is not generated from a measuring current which is an analog signal, unlike a measurement apparatus that performs the conventional analog-method synchronous detection but can be realized by digital data, the need for a phase adjustment circuit (an analog circuit) for performing phase adjustment of a reference signal is eliminated, and it becomes possible to keep the costs lower.

As described above, according to the measurement apparatus 100 according to the present embodiment, it becomes possible to perform highly accurate synchronous detection while keeping the costs low.

Further, the measurement apparatus 100 may include the communication circuit 13 that performs, in the state of the first circuit side including the signal generation circuit 3 and the D/A conversion circuit 10 and the second circuit side including the data processing control device 5 (the first synchronous detection unit 6, the second synchronous detection unit 7, and the arithmetic unit 8) being electrically insulated from each other, transmission/reception of signals between the first circuit side and the second circuit side.

As described above, the current phase signal Sip is not data with a large amount of information unlike an A/D converted signal but is a simple binary signal including only information about a phase. Therefore, even for specifications that require a circuit for generating a current to be applied to a DUT, and an arithmetic circuit and the like to be mutually electrically insulated, for example, like a battery tester, transmission of a signal becomes possible without using a high-precision communication circuit. Thereby, it becomes possible to keep the costs lower.

Further, in the measurement apparatus 100 according to the present embodiment, the signal generation circuit 3 compares the voltage signal Si obtained by converting the current i flowing in the DUT 200 to a voltage and a reference voltage (0 V) and generates a binary signal corresponding to a result of the comparison. According thereto, the signal generation circuit 3 can be realized by a relatively simple circuit configuration like a comparator circuit, and, therefore, it becomes possible to keep the costs lower.

<<Expansion of Embodiment>>

An disclosure made by the present inventor et al. has been specifically described above based on an embodiment. The present disclosure, however, is not limited thereto, and it goes without saying that the present disclosure can be variously changed within a range not departing from the spirit thereof.

For example, the flowchart described above shows an example for describing operations, and the present disclosure is not limited thereto. That is, steps shown in each drawing of the flowchart are specific examples, and the present disclosure is not limited to the flow. For example, order of a part of the processes may be changed; another process may be inserted between processes; and a part of the processes may be performed in parallel.

LIST OF REFERENCE SIGNS 1 current generation circuit,
2 voltage detection circuit,
3 signal generation circuit,
4 A/D conversion circuit,
5 data processing control device,
6 first synchronous detection unit,
7 second synchronous detection unit,
8 arithmetic unit,
9 storage unit,
10 D/A conversion circuit,
11 output unit,
12 operation unit,
13 communication circuit,
HC, LC, HP, LP external terminal,
90 current information,
Si voltage signal,
Sip current phase signal,
Ss reference signal
The invention claimed is:

1. A measurement apparatus comprising:
a current generation circuit causing an alternating constant current corresponding to a reference signal with a predetermined frequency to occur and supplying the alternating constant current to a measurement target object;
a voltage detection circuit detecting a voltage that has occurred in the measurement target object;
a signal generation circuit detecting a current flowing in the measurement target object and generating a binary signal synchronized with a phase of the detected current, the binary signal synchronized with only a phase of the detected current;
a first synchronous detection unit performing synchronous detection of the voltage detected by the voltage detection circuit, based on the reference signal and calculating an amplitude of the voltage and a voltage phase difference that is a phase difference between a phase of the voltage and a phase of the reference signal;
a second synchronous detection unit performing synchronous detection of the binary signal based on the reference signal and calculating a current phase difference that is a phase difference between the phase of the detected current flowing in the measurement target object and the phase of the reference signal; and
an arithmetic unit calculating electrical characteristics of the measurement target object based on the amplitude of the voltage and the voltage phase difference calculated by the first synchronous detection unit, the current phase difference calculated by the second synchronous detection unit, and an amplitude of the current flowing in the measurement target object, wherein the signal generation circuit compares a voltage signal obtained by converting the current flowing in the measurement target object to a reference voltage and generates the binary signal representing a binary comparison result.

2. The measurement apparatus according to claim 1, further comprising a communication circuit performing, in a state of a first circuit side including the signal generation circuit and a second circuit side including the first synchronous detection unit, the second synchronous detection unit, and the arithmetic unit being electrically insulated from each other, transmission/reception of signals between the first circuit side and the second circuit side.

3. The measurement apparatus according to claim 1, wherein the signal generation circuit compares a voltage signal obtained by converting the current flowing in the measurement target object to a voltage and a reference voltage and generates the binary signal corresponding to a result of the comparison.

4. The measurement apparatus according to claim 1, wherein
the first synchronous detection unit calculates the amplitude of the voltage and the voltage phase difference by multiplying a digital signal of the voltage detected by the voltage detection circuit and a digital signal indicating the reference signal and multiplying the digital signal of the voltage detected by the voltage detection circuit and a digital signal with a phase displaced by 90° relative to the reference signal, and
the second synchronous detection unit calculates the current phase difference by multiplying the binary signal and the digital signal indicating the reference signal and multiplying the binary signal and the digital signal with the phase displaced by 90° relative to the reference signal.

5. A measurement method comprising:
a first step of, by performing synchronous detection of a voltage that occurs in a measurement target object when an alternating constant current corresponding to a reference signal with a predetermined frequency is supplied to the measurement target object, based on the reference signal, calculating an amplitude of the voltage and a voltage phase difference that is a phase difference between a phase of the voltage and a phase of the reference signal;
a second step of generating a binary signal synchronized with a phase of a current flowing in the measurement target object when the constant current is supplied to the measurement target object, the binary signal synchronized with only a phase of the current flowing in the measurement target object, the second step including comparing a voltage signal obtained by converting the current flowing in the measurement target object into a reference voltage and generating the binary signal representing a binary comparison result;
a third step of, by performing synchronous detection of the binary signal generated at the second step, based on the reference signal, calculating a current phase difference that is a phase difference between the phase of the current flowing in the measurement target object and the phase of the reference signal; and
a fourth step of calculating electrical characteristics of the measurement target object based on the amplitude of the voltage and the voltage phase difference calculated at the first step and the current phase difference calculated at the third step.

* * * * *